US007651197B2

(12) United States Patent
Umeda et al.

(10) Patent No.: US 7,651,197 B2
(45) Date of Patent: Jan. 26, 2010

(54) METHOD OF MANUFACTURING AN INKJET HEAD THROUGH THE ANODIC BONDING OF SILICON MEMBERS

(75) Inventors: Takao Umeda, Hitachinaka (JP); Osamu Machida, Hitachinaka (JP); Jun Nagata, Hitachinaka (JP)

(73) Assignee: Ricoh Printing Systems, Ltd., Ibaraki-ken (JP)

( * ) Notice: Subject to any disclaimer, the term of this patent is extended or adjusted under 35 U.S.C. 154(b) by 484 days.

(21) Appl. No.: 11/314,741

(22) Filed: Dec. 22, 2005

(65) Prior Publication Data

US 2006/0139407 A1 Jun. 29, 2006

(30) Foreign Application Priority Data

Dec. 24, 2004 (JP) .......................... P2004-372475

(51) Int. Cl.
*B41J 2/04* (2006.01)
*H01L 41/22* (2006.01)
*H01L 21/30* (2006.01)
*H01L 21/46* (2006.01)
*H04R 17/00* (2006.01)

(52) U.S. Cl. ......................... 347/54; 29/25.35; 438/455

(58) Field of Classification Search .............. 347/70–71
See application file for complete search history.

(56) References Cited

U.S. PATENT DOCUMENTS 6,260,960 B1 * 7/2001 Hashizume et al. ........... 347/70

FOREIGN PATENT DOCUMENTS

| | | |
|---|---|---|
| JP | 5-50601 | 3/1993 |
| JP | 6-55733 | 3/1994 |
| JP | 2002 210988 | 7/2002 |
| JP | 2004-216747 | 8/2004 |

OTHER PUBLICATIONS

Full translation of JP2004216747A.*
Full translation of JP2004216747A on Aug. 6, 2008.*
Office Action issuded by the Chinese Patent and Trademark Office on Apr. 13, 2007 with English language translation, pp. 1-9.

* cited by examiner

*Primary Examiner*—Matthew Luu
*Assistant Examiner*—Lisa M Solomon
(74) *Attorney, Agent, or Firm*—Whitham Curtis Christofferson & Cook, P.C.

(57) ABSTRACT

In a method of manufacturing an inkjet head, a silicon dioxide ($SiO_2$) layer is produced on the surface of first silicon member formed from single-crystal silicon. Next, a glass layer formed of borosilicate glass or the like is sputtered onto the surface of the silicon dioxide ($SiO_2$) layer. A silicon oxide ($SiO_x$, x<2) layer is then formed on the surface of a second silicon member. The first and second silicon members and are bonded together by applying heat at about 450° C. with heaters, as a DC voltage is applied across electrode terminals. As a result, a silicon dioxide ($SiO_2$) layer is formed at the interface of the glass layer and silicon oxide ($SiO_x$, x<2) layer, anodically bonding the two layers.

5 Claims, 10 Drawing Sheets

METHOD OF MANUFACTURING AN INKJET HEAD THROUGH THE ANODIC BONDING OF SILICON MEMBERS

BACKGROUND OF THE INVENTION

1. Field of the Invention

The present invention relates to an inkjet head and an inkjet recording device equipped with the inkjet head, as well as a method of anodically bonding silicon members and a method of manufacturing the inkjet head. The present invention particularly relates to a method of anodically bonding silicon members and method of manufacturing an inkjet head by anodically bonding the silicon members after an oxide layer has been formed on the surfaces thereof. These methods are capable of providing an anodically bonded member and an inkjet head that are resistant to the corrosive properties of various types of ink, including alkaline ink.

2. Description of the Related Art

Inkjet printers are widely used as personal color printers. Normally, these printers use water-based ink. Recently, however, wide-format printers have been used in industrial applications to print signboards, advertisements, and the like. In addition to water-based ink, these wide-format printers also use oil-based ink and solvent ink.

There has also been a trend toward using inkjet heads that employ piezoelectric elements such as PZT in industrial applications. Some examples of these applications are thin film forming devices used in the manufacturing of liquid crystal panels and other displays, interconnection pattering devices using metal nanopaste as ink, and devices for applying metal-catalyzed ink on fuel cells and the like. The ink used in these applications may be acidic, alkaline, polar solvent, and the like. In order to support these diverse types of inks, the components constituting the structure of the inkjet head, and particularly the components that come into contact with the ink, must be resistant to corrosion.

Further, in order to meet the demands for high quality and high resolution in the printing applications and demands for fine pattern printing in industrial applications, it is desirable to develop a high-density printing head capable of ejecting fine ink droplets of 10 picoliters (pL) or less with high precision. One method for meeting these demands is proposed in Japanese Patent Application Publication No. HEI-6-55733. This method proposes to produce parts constituting a print head structure by performing MEMS (Micro Electro Mechanical Systems) machining of silicon members.

Further, Japanese Patent Application Publication No. HEI-5-50601 proposes a method of joining the silicon member and glass substrate through anodic bonding instead of using adhesive for this bonding.

Japanese Patent Application Publication No. 2004-216747 proposes a method of manufacturing an orifice substrate, ink chamber substrate, and diaphragm substrate as components of the print head through dry etching of silicon material. An inkjet head is then produced by joining these substrates using anodic bonding.

Next, a conventional method of anodic bonding will be described in which two silicon members are bonded with glass interposed therebetween. In this description, two single-crystal silicon substrates are joined by anodic bonding. First, a silicon dioxide ($SiO_2$) layer is formed on a surface of one silicon substrate, and a layer of borosilicate glass is formed in turn on the surface of the silicon dioxide layer.

Next, the three-layer substrate comprising the silicon substrate, silicon dioxide layer, and borosilicate glass layer is laminated over the other single-crystal silicon substrate so that the borosilicate glass layer contacts the other substrate.

The three-layer substrate and the other silicon substrate are bonded anodically by applying heat and electricity to the laminated structure.

The method of manufacturing an inkjet head disclosed in Japanese Patent Application Publication No. 2004-216747 uses the anodic bonding method described above. In this method, single-crystal silicon is subjected to dry etching to form an orifice substrate, ink chamber substrate, and diaphragm substrate. The surfaces of the orifice substrate and diaphragm substrate are then subjected to an oxidation treatment at temperatures over 1000° C. to form a silicon dioxide ($SiO_2$) layer on the surfaces of the substrates. Next, a borosilicate glass layer is formed on the surface of the silicon oxide layer on the side to be joined with the ink chamber substrate. The orifice substrate and ink chamber substrate are then joined through the anodic bonding method described above. Similarly, the ink chamber substrate and diaphragm substrate are joined by the anodic bonding method, thereby producing the inkjet head.

SUMMARY

However, the following problems occur when manufacturing an inkjet head according to the method described above. First, since the walls of a manifold, pressure chambers, and the like that constitutes the ink chamber are formed of single-crystal silicon, the ink comes into direct contact with this single-crystal silicon material. Since alkaline solutions corrode single-crystal silicon, this configuration cannot be used for a print head that ejects alkaline ink.

Further, the following problem arises because of the need for performing chemical vapor deposition of borosilicate glass in order to anodically bond the surface of the orifice substrate. About 100-300 nozzles are provided in the orifice substrate for ejecting ink. The nozzles have a diameter of around 30 μm. In order to eject microdroplets from these nozzles with stability, the nozzles must have uniform circular cross sections and uniform diameters with no variations. However, when depositing the borosilicate glass layer at a thickness of 1-4 μm, it is impossible to avoid depositing some of the borosilicate glass inside the nozzles. As a result, the inner diameter of the nozzles will become smaller than the inner diameter produced by the machining process, and irregularities in the deposition may cause some of the nozzles to clog, may modify the direction that the ink droplets are ejected, or may cause other problems.

In view of the foregoing, it is an object of the present invention to provide a method of manufacturing an inkjet head by providing a new anodic bonding method that will not deposit deposition matter in the nozzle holes, whereby the ink chambers will not corrode when using various types of ink, including alkaline solvent. It is another object of the present invention to provide an inkjet head and an inkjet recording device capable of producing images of high quality and high resolution using the method of manufacturing an inkjet head.

In order to attain the above and other objects, the present invention provides a method of anodically bonding silicon members, the method including:

forming a silicon dioxide ($SiO_2$) layer on a surface of a first silicon member;

forming a glass layer on a surface of the silicon dioxide ($SiO_2$) layer;

forming a silicon oxide ($SiO_x$, $x<2$) layer more deficient in oxygen than $SiO_2$ on a surface of a second silicon member; and bonding the first silicon member to the second silicon member by placing the surface of the glass layer in contact with the surface of the silicon oxide ($SiO_x$, x<2) layer and applying heat to the first and second silicon members and a voltage across the first and second silicon members.

In another aspect of the invention, there is provided a method of manufacturing an inkjet head, the method including:

manufacturing an ink chamber substrate having pressure chambers, and an orifice substrate having nozzle holes for ejecting ink, each of ink chamber substrate and the orifice substrate being formed from silicon material;

forming a silicon dioxide ($SiO_2$) layer on a surface of the ink chamber substrate;

forming a glass layer on a surface of the silicon dioxide ($SiO_2$) layer;

forming an oxygen-deficient silicon oxide ($SiO_x$, x<2) layer on a surface of the orifice substrate;

anodically bonding the ink chamber substrate to the orifice substrate by placing the glass layer in contact with the silicon oxide ($SiO_x$, x<2) layer so that the pressure chambers are in fluid communication with the nozzle holes and applying heat to the ink chamber substrate and the orifice substrate and a DC voltage across the ink chamber substrate and the orifice substrate; and bonding a diaphragm substrate having a diaphragm for pressurizing the pressure chambers to a side of the ink chamber substrate opposite the side that the orifice substrate is bonded.

In another aspect of the invention, there is provided a method of manufacturing an inkjet head, the method including:

manufacturing an ink chamber substrate having pressure chambers, a diaphragm substrate having a diaphragm for pressurizing the pressure chambers, and an orifice substrate having nozzle holes for ejecting ink, each of ink chamber substrate, the diaphragm substrate, and the orifice substrate being formed from silicon material;

forming a silicon dioxide ($SiO_2$) layer on a surface of the ink chamber substrate;

forming a glass layer on a surface of the silicon dioxide ($SiO_2$) layer;

forming an oxygen-deficient silicon oxide ($SiO_x$, x<2) layer on a surface of the orifice substrate and the diaphragm substrate; and anodically bonding the diaphragm substrate, orifice substrate, and ink chamber substrate by sequentially laminating the diaphragm substrate, ink chamber substrate, and orifice substrate and applying a DC voltage across the ink chamber substrate, the diaphragm substrate, and the orifice substrate.

In another aspect of the invention, there is provided an inkjet head including an ink chamber substrate, a diaphragm substrate, a piezoelectric element, and an orifice substrate. The ink chamber substrate has pressure chambers. The diaphragm substrate is bonded to the ink chamber substrate. The piezoelectric element is bonded to the diaphragm substrate for applying pressure to the pressure chambers in response to electric signals. The orifice substrate has nozzle holes for ejecting ink. The orifice substrate is bonded to the ink chamber substrate and is pressurized by the diaphragm substrate. The pressure chambers is in fluid communication with the nozzle holes.

Silicon oxide layers are formed on the surface of the ink chamber substrate which forms the pressure chambers, and surfaces of the diaphragm substrate and orifice substrate that come into contact with ink when the pressure chambers and the nozzle holes include ink.

In another aspect of the invention, there is provided an inkjet head including an ink chamber substrate, a diaphragm substrate, a piezoelectric element, and an orifice substrate. The ink chamber substrate has pressure chambers. The diaphragm substrate is bonded to the ink chamber substrate. The piezoelectric element is bonded to the diaphragm substrate for applying pressure to the pressure chambers in response to electric signals. The orifice substrate having nozzle holes for ejecting ink, the orifice substrate is bonded to the ink chamber substrate and is pressurized by the diaphragm substrate. The pressure chambers is in fluid communication with the nozzle holes.

The ink chamber substrate includes a silicon member, a silicon dioxide ($SiO_2$) layer formed on a surface of the silicon member, and a glass layer formed on a surface of the silicon dioxide ($SiO_2$) layer. The orifice substrate includes a silicon member, and a silicon oxide ($SiO_x$, x<2) layer formed on a surface of the silicon member. The ink chamber substrate and orifice substrate are joined by anodic bonding.

In another aspect of the invention, there is provided an inkjet head including an ink chamber substrate, a diaphragm substrate, a piezoelectric element, and an orifice substrate. The ink chamber substrate has pressure chambers. The diaphragm substrate is bonded to the ink chamber substrate. The piezoelectric element is bonded to the diaphragm substrate for applying pressure to the pressure chambers in response to electric signals. The orifice substrate has nozzle holes for ejecting ink. The orifice substrate is bonded to the ink chamber substrate and being pressurized by the diaphragm substrate. The pressure chambers being in fluid communication with the nozzle holes.

The ink chamber substrate includes a silicon member, a silicon dioxide ($SiO_2$) layer formed on a surface of the silicon member, and a glass layer formed on a surface of the silicon dioxide ($SiO_2$) layer. The orifice substrate and the diaphragm substrate each includes a silicon member, and a silicon oxide ($SiO_x$, x<2) layer formed on a surface of the silicon member. The ink chamber substrate, orifice substrate, and diaphragm substrate are joined together by anodic bonding.

In another aspect of the invention, there is provided an inkjet head including the above-described inkjet head and a control unit that controls the inkjet head.

DESCRIPTION OF THE PREFERRED EMBODIMENTS

Figure 1A:
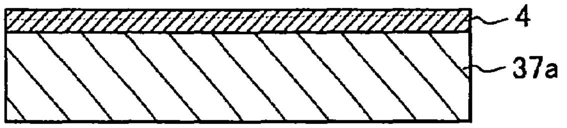
FIG. 1(*a*)-1(*d*) is an explanatory diagram illustrating an anodic bonding method according to the present invention.
Figure 1B:
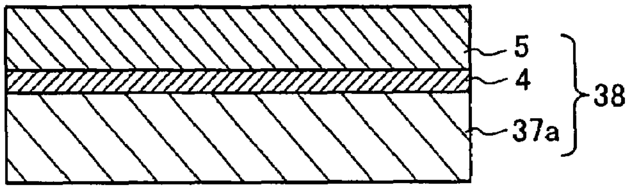
Figure 1C:
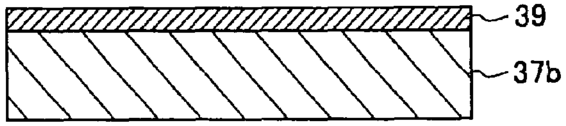
Figure 1D:
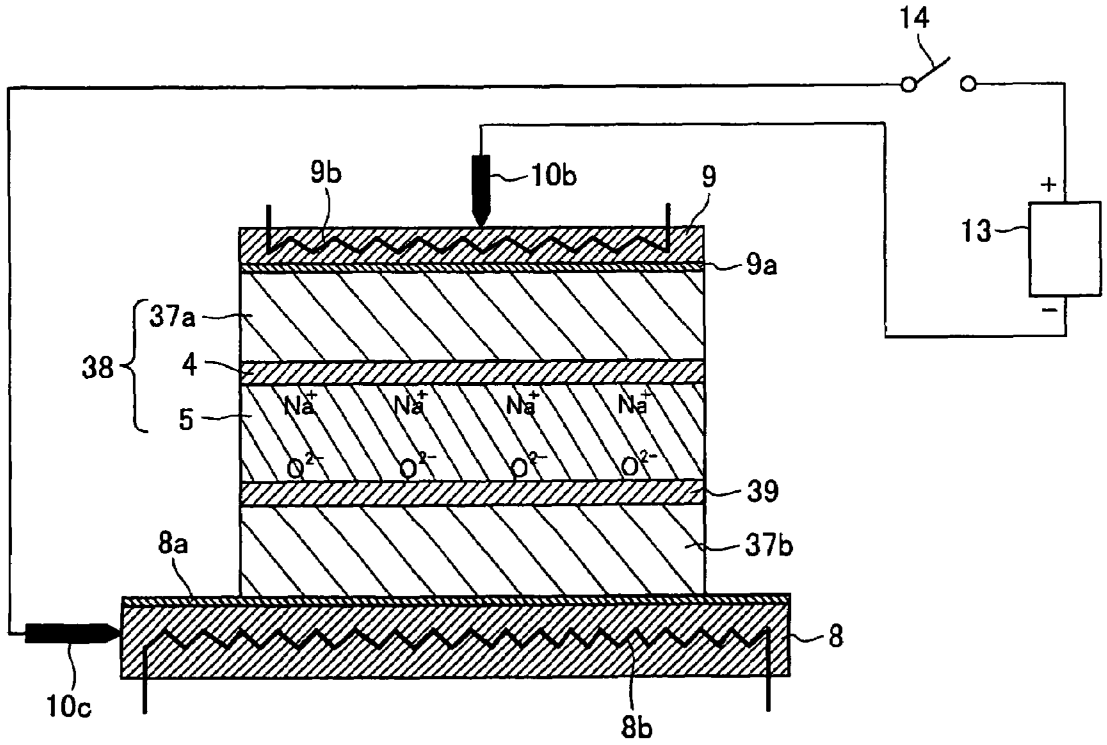

An anodic bonding method, the structure of an inkjet head, and a method of manufacturing the inkjet head using the anodic bonding method will be described according to preferred embodiments of the present invention. Further, an inkjet recording device using the inkjet heads according to the present invention, and uses and applications for the inkjet recording device will also be described.

(1) Method of Anodically Bonding Silicon Members

FIG. 1(*a*)-1(*c*) illustrates a method of anodically bonding silicon members according to the present invention. As shown in FIG. 1(*a*), a first silicon member 37*a* is prepared from single-crystal silicon. A silicon dioxide ($SiO_2$) layer 4 having the thickness of about 1 μm is formed on a surface of the first silicon member 37*a* by oxidizing the surface in a water vapor atmosphere at 1150° C., for example. Next, as shown in FIG. 1(*b*), a glass layer 5 formed of borosilicate glass or Pyrex glass is sputtered onto the surface of the silicon dioxide ($SiO_2$) layer 4. The borosilicate glass layer is formed of a material comprising primarily $SiO_2$, $B_2O_3$, and the like and including $Na_2O$ and traces of $Al_2O_3$. Normally, the silicon dioxide ($SiO_2$) layer 4 is set to a thickness of from 0.05 μm to a few μm, while the glass layer 5 is set to a thickness from 0.5 μm to a few am. The single-crystal silicon is a semiconductor with a low volume resistivity of no more than $10^5$ Ω·cm, which is far greater than that of the silicon dioxide ($SiO_2$) layer 4 and the glass layer 5.

In the meantime, a second silicon member 37*b* is prepared from single-crystal silicon. As shown in FIG. 1(*c*), a silicon oxide ($SiO_x$, x<2) layer 39 more deficient in oxygen than the silicon dioxide ($SiO_2$) layer 4 is formed on a surface of the second silicon member 37*b*. This is accomplished by first forming a silicon dioxide ($SiO_2$) layer by heating the second silicon member 37*b* at 1150° C. in a water vapor atmosphere and subsequently irradiating the layer with ultraviolet rays from a low-pressure mercury lamp. The ultraviolet rays release a portion of the oxygen in the silicon dioxide ($SiO_2$) layer, resulting in the silicon oxide ($SiO_x$, x<2) layer 39.

Next, the second silicon member 37*b* is placed on a stainless steel mount 8, as shown in FIG. 1(*d*). The mount 8 has a built-in heater 8*b*, and an electrode film 8*a* formed on the surface that contacts the second silicon member 37*b*. The first silicon member 37*a* is stacked on top of the second silicon member 37*b* so that the surface of the glass layer 5 is in contact with the silicon oxide ($SiO_x$, x<2) layer 39.

A pressing/heating plate 9 formed of metal is placed on top of the first silicon member 37*a*. The pressing/heating plate 9 has a built-in heater 9*b*, and an electrode film 9*a* that contacts the first silicon member 37*a*. The pressing/heating plate 9 functions as a pressing plate for improving the adhesion between the first and second silicon members 37*a* and 37*b*. The electrode films 8*a* and 9*a* are preformed on the surfaces of the mount 8 and pressing/heating plate 9, respectively, for ensuring good electrical contact. The electrode films 8*a* and 9*a* are formed under a high temperature of 300-500° C. through vapor deposition or electroplating of platinum, gold, silver, or other metal having stable electrical properties. Electrode terminals 10*c* and 10*b* connected to a DC power supply 13 are placed in contact with the mount 8 and pressing/heating plate 9, respectively. A switch 14 is closed to apply a DC voltage across the terminals.

In the case of anodic bonding, a power source (not shown) supplies electricity to the heaters 8*b* and 9*b* for heating the mount 8 and pressing/heating plate 9 until the first and second silicon members 37*a* and 37*b* are heated to about 450° C.

Next, the switch 14 is closed, applying a DC voltage of 200 V, for example, across the electrode terminals 10*b* and 10*c*. At this time, a current flows through the glass layer 5 along with the migration of natrium ions ($Na^+$) and oxygen ions ($O^{2-}$). This condition is maintained for a prescribed length of time, forming chemical bonds between the oxygen ions ($O^{2-}$) and the $SiO_x$ (x<2) of the silicon oxide ($SiO_x$, x<2) layer 39 formed on the surface of the second silicon member 37*b*. As a result, a silicon dioxide ($SiO_2$) layer is formed at the interface between the glass layer 5 and the silicon oxide ($SiO_x$, x<2) layer 39, completing an anodic bond therebetween.

When this method of anodic bonding is used to manufacture an inkjet head, a silicon oxide layer is formed on the surfaces of the pressure chambers and the like, as described below. Hence, the surfaces can resist corrosion when placed in contact with alkaline solutions.

In the method of anodic bonding, nothing is formed at an interface between the glass layer 5 and the silicon oxide (SiO, X<2) layer 39 but a thin silicon dioxide ($SiO_2$) layer. Accordingly, corrosion resistance of anodically bonded member is not a matter of concern. Further, it is advantageous in that the bonding strength according to the method of anodic bonding is stronger than that of bonding with an adhesive and a welding junction.

(2) Structure and Manufacturing Method of an Inkjet Head

Next, the structure and manufacturing method of an inkjet head according to preferred embodiments of the present invention will be described. The manufacturing method employs the anodic bonding method described above.

Figure 2:
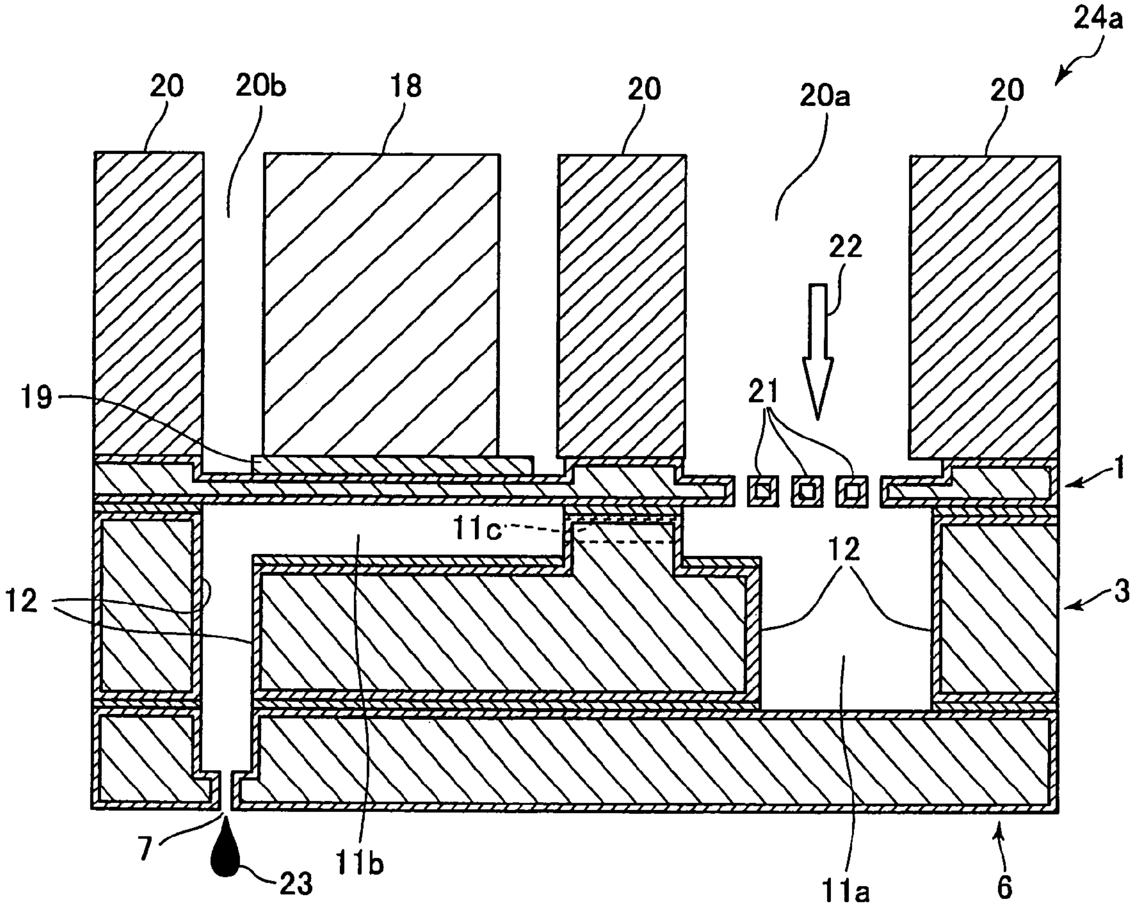
FIG. 2 is a schematic diagram of an inkjet head according to the first embodiment.

First, the structure of the inkjet head according to a first embodiment will be described. As shown in FIG. 2, an inkjet head 24*a* includes an orifice substrate 6, an ink chamber substrate 3, a diaphragm substrate 1, and a housing 20. The diaphragm substrate 1, ink chamber substrate 3, and orifice substrate 6 are produced by subjecting single-crystal silicon to MEMS machining. Further, nozzles 7 are formed in the orifice substrate 6. A manifold 11*a*, pressure chambers 11*b*, and a restrictor 11*c* are formed in the ink chamber substrate 3. The manifold 11*a* and pressure chambers 11*b* are in communication with each other via the restrictor 11*c*. An ink supply channel 20*a*, and a piezoelectric element insertion opening 20*b* are formed in the housing 20. A filter 21 is formed in the area of the diaphragm substrate 1 corresponding to the ink supply channel 20*a*. The ink supply channel 20*a* and manifold 11*a* are in communication via the filter 21. A piezoelectric element 18 is disposed in the piezoelectric element insertion opening 20*b*. The piezoelectric element 18 is connected to the diaphragm substrate 1 by an adhesive 19.

With this construction, an ink 22 supplied from an ink tank (not shown) passes through the filter 21, manifold 11*a*, and restrictor 11*c* and is supplied into the pressure chambers 11*b* and the nozzles 7. When a signal is applied to the piezoelectric element 18, the diaphragm substrate 1 is oscillated, causing an ink droplet 23 to be ejected from the nozzle 7.

Figure 3A:
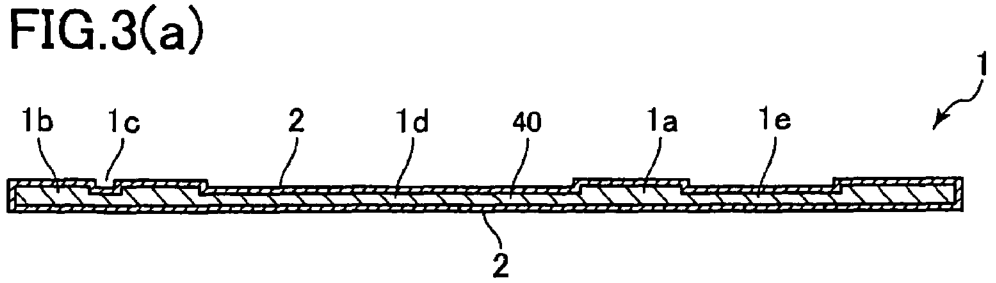
FIG. 3(*a*)-3(*c*) is an explanatory diagram illustrating steps in a method of manufacturing an inkjet head according to a first embodiment of the present invention.
Figure 3B:
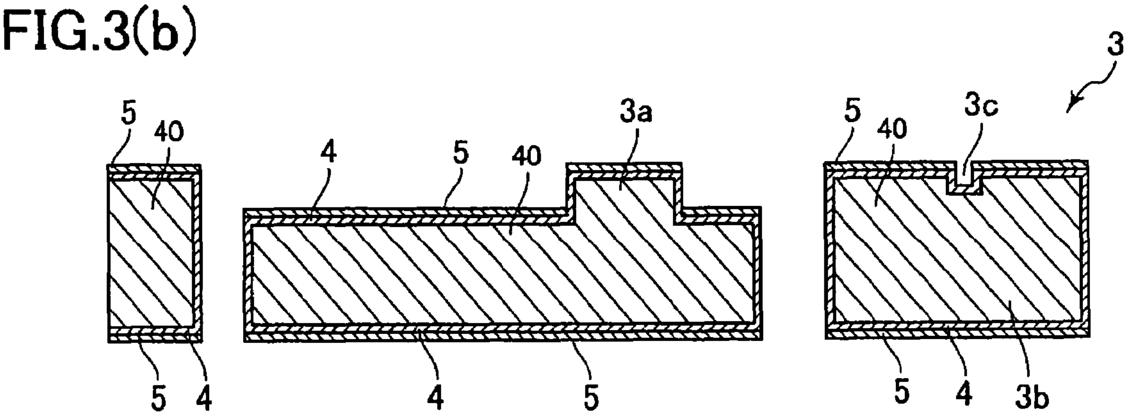
Figure 3C:
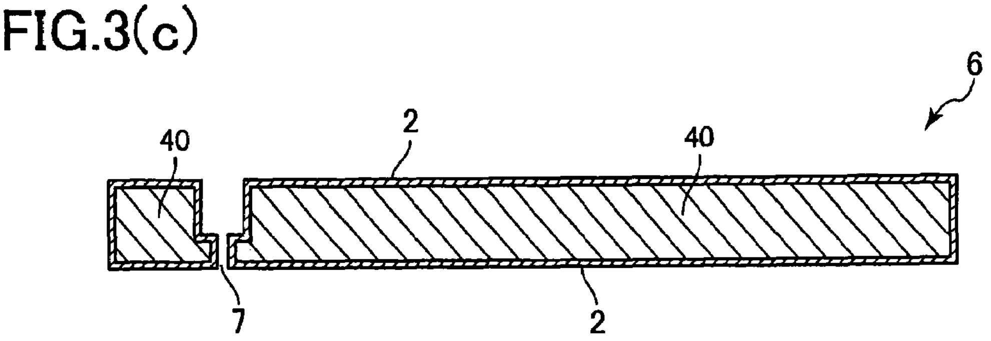

Next, a method of manufacturing the inkjet head 24*a* will be described with reference to FIGS. 3(*a*) through 4. First, the diaphragm substrate 1, ink chamber substrate 3, and orifice substrate 6 are manufactured from single-crystal silicon substrates 40 according to a MEMS machining process. As shown in FIG. 3(*a*), the diaphragm substrate 1 has a bonding part 1*a*, a vibrating part 1*d*, a filter part 1*e*, and a terminal part 1*b*. The bonding part 1*a* is bonded to the ink chamber substrate 3, and the vibrating part 1*d* is fixed to the piezoelectric element 18 (see FIG. 2) and vibrates when the piezoelectric element 18 deforms. The filter 21 (see FIG. 2) is formed in the filter part 1*e* and constitutes part of an ink channel. The terminal part 1*b* is a terminal for applying a voltage. A cutout part 1*c* is also formed in the diaphragm substrate 1 for cutting and removing the terminal part 1*b* after anodic bonding described later has been completed. After manufacturing the diaphragm substrate 1 through MEMS machining, a silicon oxide ($SiO_x$, x<2) layer 2 more deficient in oxygen than $SiO_2$ is formed on the surfaces of the diaphragm substrate 1. To form the silicon oxide ($SiO_x$, x<2) layer 2, a silicon dioxide ($SiO_2$) layer is first formed by heating the diaphragm substrate 1 at 1150° C. in a water vapor atmosphere. Subsequently, the layer is irradiated with ultraviolet rays from a low-pressure mercury lamp to release oxygen in the layer. It is also possible to form the silicon oxide ($SiO_x$, x<2) layer 2 by controlling the oxygen density when thermally oxidizing the single-crystal silicon substrate.

As shown in FIG. 3(*b*), the ink chamber substrate 3 includes a bonding part 3*a*, and a terminal part 3*b*. The bonding part 3*a* is bonded to the diaphragm. The terminal part 3*b* is a terminal for applying a voltage. A cutout part 3*c* is also formed in the ink chamber substrate 3 for cutting and removing the terminal part 3*b* after anodic bonding described later has been completed.

After the ink chamber substrate 3 is manufactured by MEMS machining, a silicon dioxide ($SiO_2$) layer 4 having a thickness of about 1 μm is formed on the surfaces of the ink chamber substrate 3. Subsequently, a borosilicate glass layer 5 having a thickess of about 2 μm is further formed on the surfaces of the silicon dioxide ($SiO_2$) layer 4 by sputtering.

As shown in FIG. 3(*c*), a silicon oxide ($SiO_x$, x<2) layer 2 having a thickness of about 1 μm is formed on the surfaces of the orifice substrate 6. The silicon oxide ($SiO_x$, x<2) layer 2 is formed according to the same method described above.

Figure 4:
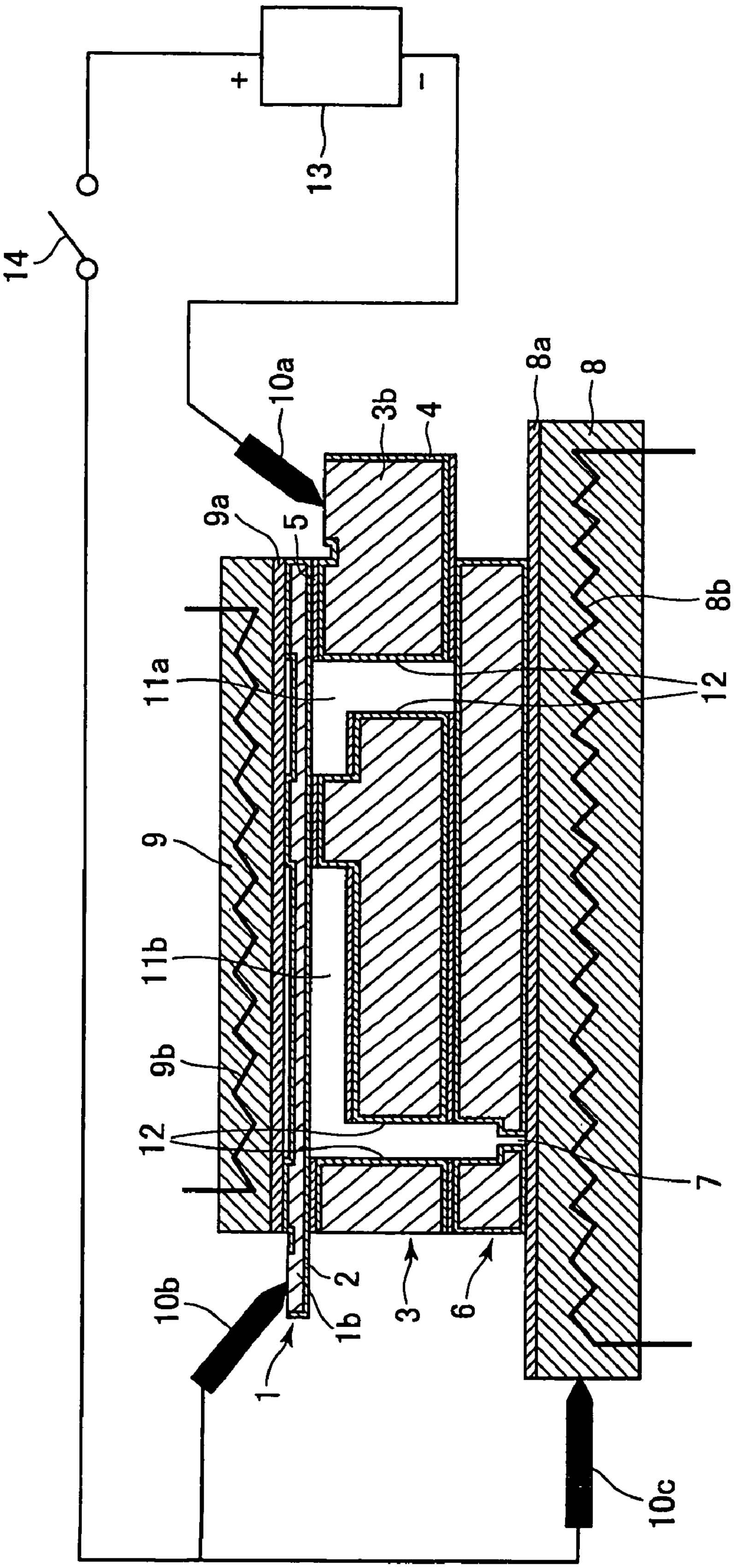
FIG. 4 is an explanatory diagram illustrating steps in an anodic bonding method used in the method of manufacturing an inkjet head according to the first embodiment.

Next, the diaphragm substrate 1, ink chamber substrate 3, and orifice substrate 6 formed according to the method described above are stacked together, as shown in FIG. 4, on the mount 8 with the orifice substrate 6 on the bottom. The pressing/heating plate 9 is stacked on top of the diaphragm substrate 1.

At this time, the silicon oxide ($SiO_x$, x<2) layer 2 formed on the surface of the terminal part 1*b* is removed through mechanical polishing or a chemical process, and the terminal part 1*b* is placed in electrical contact with the electrode terminal 10*b*.

Next, the silicon dioxide ($SiO_2$) layer 4 and glass layer 5 formed on the surface of the terminal part 3*b* are removed by a chemical process, and the terminal part 3*b* is placed in electrical contact with an electrode terminal 10*a*. The electrode terminal 10*c* is also placed in contact with the mount 8. Electricity is supplied to the orifice substrate 6 via the mount 8, since a large portion of the flat surface of the orifice substrate 6, excluding the nozzle 7 region, is in contact with the mount 8.

Electricity is also supplied to the heaters 8*b* and 9*b* for heating the mount 8 and pressing/heating plate 9. When the switch 14 is closed, the DC power supply 13 applies a 200V DC voltage to the electrode terminal 10*a*, electrode terminal 10*b*, and electrode terminal 10*c*. At this time, the diaphragm substrate 1, ink chamber substrate 3, and orifice substrate 6 are anodically bonded according to the principles described above with reference to FIG. 1(*d*), forming an integrally bonded unit of three components.

Next, the terminal part 1*b* and terminal part 3*b* are removed, and the housing 20 is mounted on the diaphragm substrate 1, as shown in FIG. 2. The piezoelectric element 18 is also mounted on the diaphragm substrate 1 with the adhesive 19, completing the inkjet head 24*a*.

In the inkjet head 24*a* manufactured as described above, walls 12 of the manifold 11*a* and pressure chambers 11*b* that constitute the ink chamber are formed of a silicon dioxide ($SiO_2$) layer. Further, the inner walls of the nozzles 7 are configured of a silicon oxide ($SiO_x$, x<2) layer. Hence, no silicon parts are exposed. Therefore, in addition to water-based, oil-based, solvent, and UV inks, this structure can support industrial inks such as acidic, alkaline, and polar solvent inks used for forming interconnections, display panels, and the like. Further, by manufacturing the diaphragm substrate 1, ink chamber substrate 3, and orifice substrate 6 with a MEMS machining technique for dry etching a single-crystal silicon substrate, a highly precise inkjet head can be manufactured.

While the orifice substrate 6 and diaphragm substrate 1 have areas with fine structures, only the silicon oxide ($SiO_x$, x<2) layer 2 is formed over these substrates, thereby maintaining the precision of the fine shapes produced from the MEMS process. On the other hand, while the glass layer is deposited on the ink chamber substrate 3, the ink chamber substrate 3 does not have such particularly fine structural parts. Hence, the precision in the shape of the parts formed during MEMS machining can also be maintained on the ink chamber substrate 3.

Since the glass layer 5 is not deposited on the orifice substrate 6, in which the fine nozzles 7 are formed, the diameter of the nozzles 7 can be reduced to about 25 μm, for example. Accordingly, the inkjet head 24*a* can eject microdroplets smaller than conventional inkjet heads.

By not using adhesive to join the orifice substrate 6 and the like, the effects of adhesive protruding near the nozzles on ink ejection properties can be prevented. Further, there is no danger of such adhesive breaking off and clogging the nozzles 7 or otherwise degrading reliability.

Figure 5A:
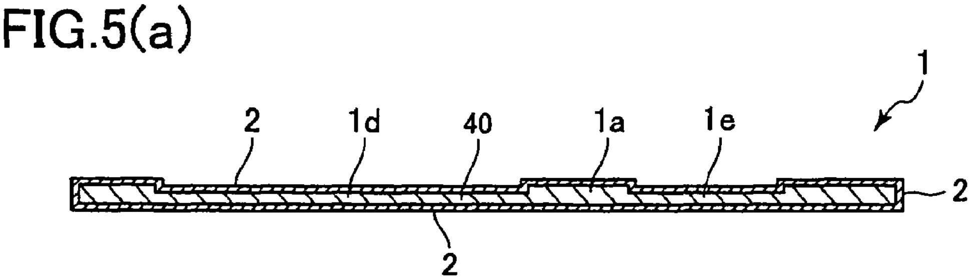
FIG. 5(*a*)-5(*c*) is an explanatory diagram illustrating steps in a method of manufacturing an inkjet head according to a second embodiment of the present invention.
Figure 5B:
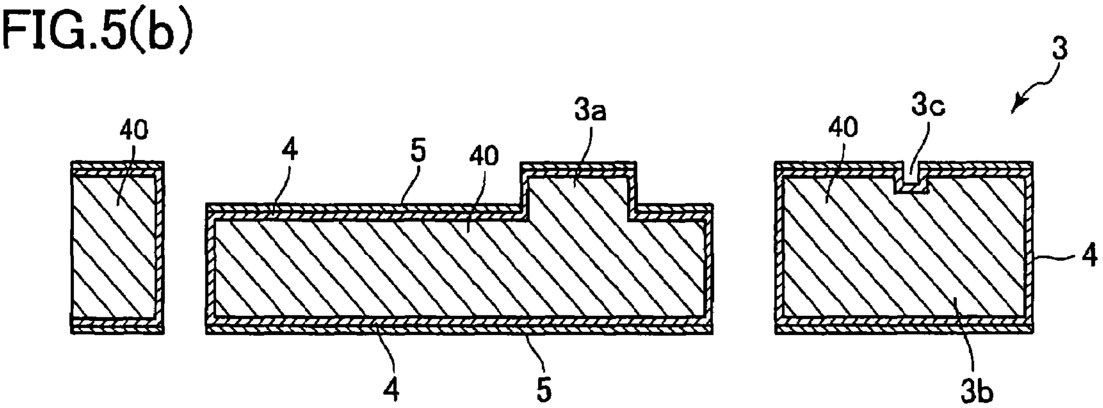
Figure 5C:
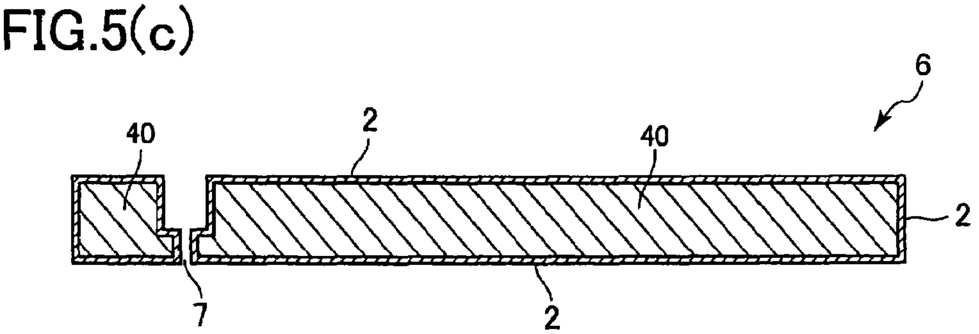
Figure 6:
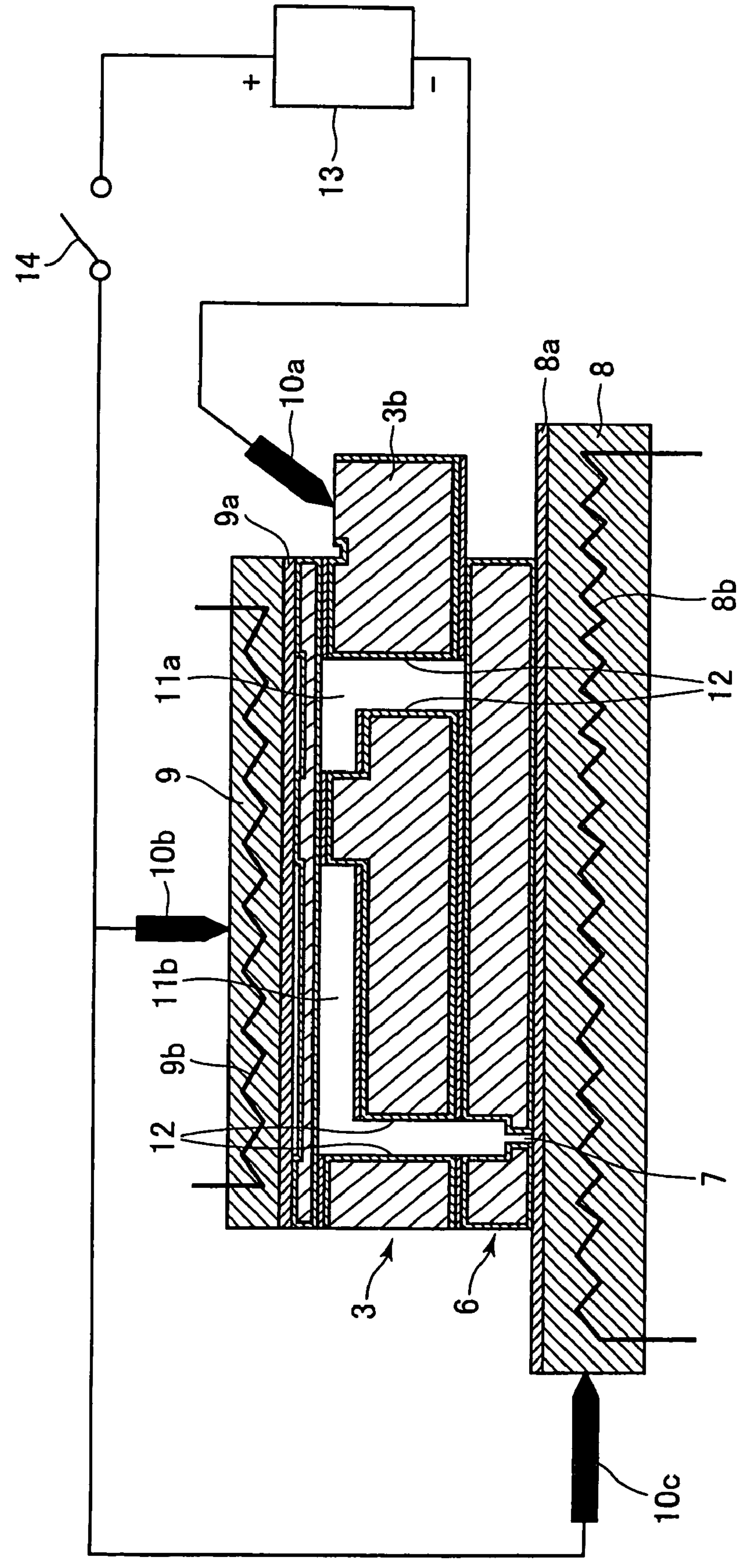
FIG. 6 is an explanatory diagram illustrating steps in an anodic bonding method used in the method of manufacturing an inkjet head according to the second embodiment.
Figure 7A:
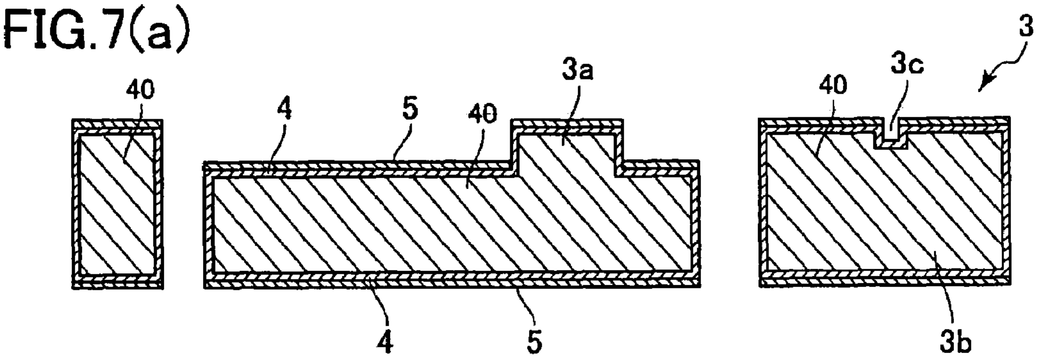
FIG. 7(*a*)-7(*d*) is an explanatory diagram illustrating steps in a method of manufacturing an inkjet head according to a third embodiment of the present invention.
Figure 7B:
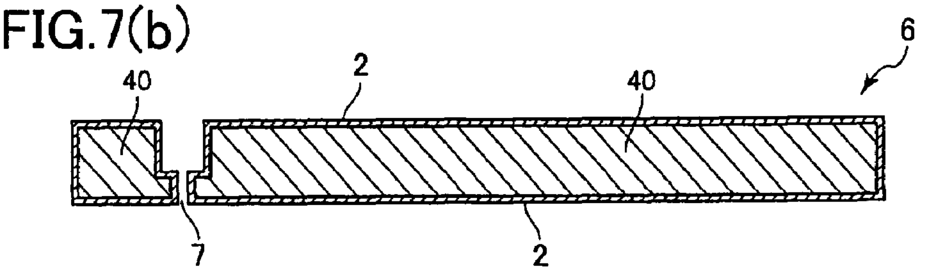
Figure 7C:
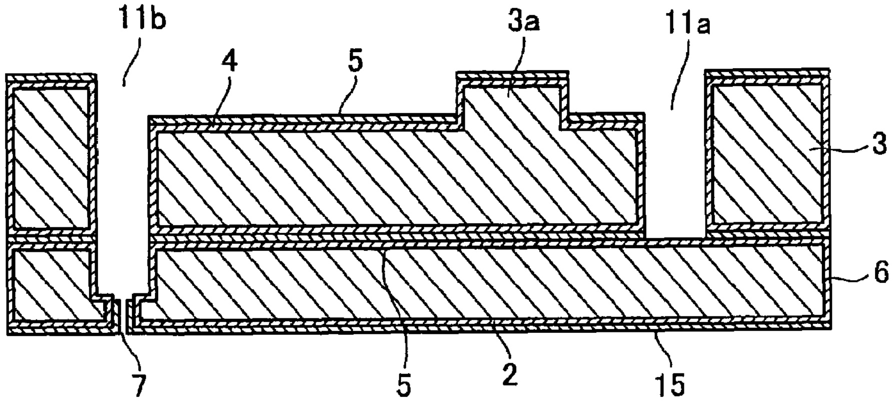
Figure 7D:
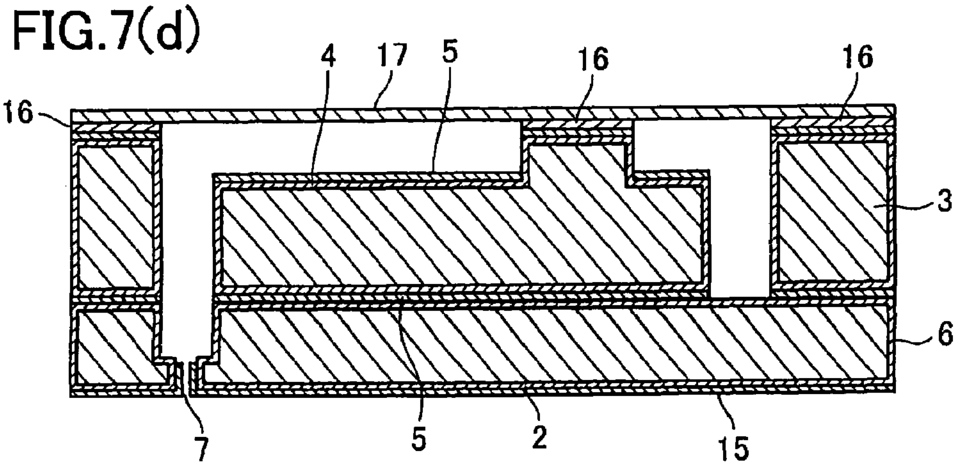

FIGS. 5 and 6 illustrate a method of manufacturing an inkjet head according to a second embodiment of the present invention. The second embodiment differs from the first embodiment in that the terminal part 1*b* for applying a voltage to the diaphragm substrate 1 is eliminated. Further, the silicon oxide layer is formed in a process of oxidizing the surface of a single-crystal silicon member in which process the member is maintained at a high temperature in an oxygen atmosphere. The silicon oxide ($SiO_x$, x<2) layer 2 of the orifice substrate 6 and the diaphragm substrate 1 is formed on the surface of the single-crystal silicon substrates 40 by thermally oxidizing the substrates at a low temperature of 600° C. in an oxygen atmosphere. The thickness of the silicon oxide ($SiO_x$, x<2) layer 2 is only 0.1 μm.

On the other hand, the silicon dioxide ($SiO_2$) layer 4 of the ink chamber substrate 3 is formed on the surface of the single-crystal silicon substrates 40 by thermally oxidizing the substrate at a high temperature of 1100° C. with a high oxygen density. The glass layer 5 is subsequently formed on the silicon dioxide ($SiO_2$) layer 4. The thickness of the silicon dioxide ($SiO_2$) layer 4 is 1 μm.

FIG. 6 shows the method of anodically bonding the orifice substrate 6, ink chamber substrate 3, and diaphragm substrate 1 of FIG. 5. Since the diaphragm substrate 1 has fewer flat portions than the orifice substrate 6, the contact surface area between the diaphragm substrate 1 and pressing/heating plate 9 is smaller. However, since the silicon oxide ($SiO_x$, x<2) layer 2 is thinner in the second embodiment, a voltage can be applied to the diaphragm substrate 1 via the stainless steel pressing/heating plate 9. The bonding conditions for applying heat and pressure to the components are the same as those described in the first embodiment and will not be repeated here. In the second embodiment, the manufacturing process of the diaphragm substrate 1 is simpler, since the terminal part 1*b* for applying a voltage during anodic bonding and the cutout part 1*c* for cutting and removing the terminal part 1*b* in the first embodiment are not necessary.

FIGS. 7(*a*) through 8 show a method of manufacturing an inkjet head according to a third embodiment of the present invention. In the first and second embodiments described above, the diaphragm substrate 1 is formed from single-crystal silicon substrates 40. However, in the third embodiment, the diaphragm substrate 1 is formed of a polymer film, such as a polyimide resin, an aramid resin, or a polysulfan resin.

Figure 8:
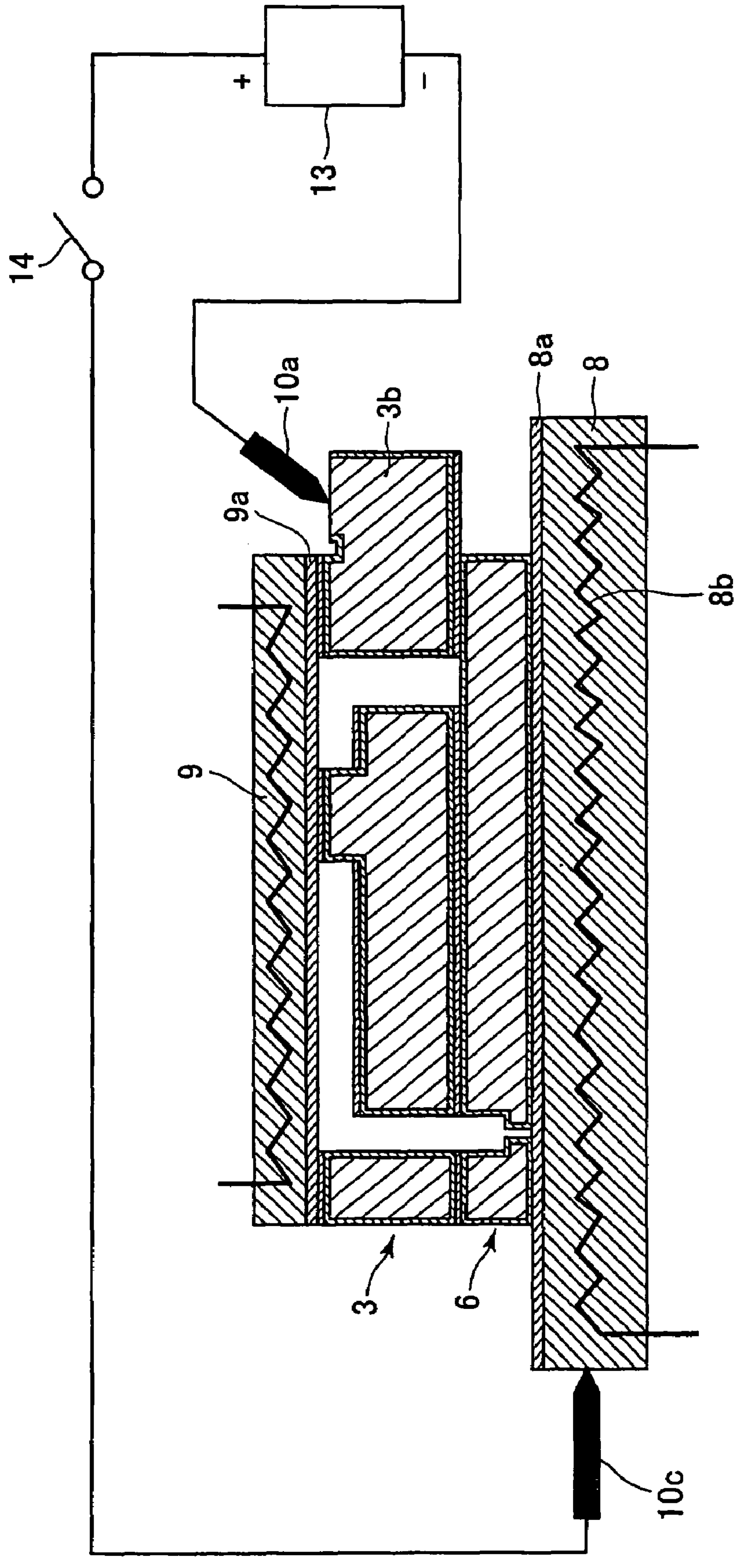
FIG. 8 is an explanatory diagram illustrating steps in an anodic bonding method used in the method of manufacturing an inkjet head according to the third embodiment.

As shown in FIG. 7(*a*), the ink chamber substrate 3 is formed according to the same process described in FIG. 5(*b*). As shown in FIG. 7(*b*), the orifice substrate 6 is formed according to the same process described in FIG. 5(*c*). Next, the ink chamber substrate 3 and orifice substrate 6 are stacked as shown in FIG. 8. The electrode terminal 10*a* is placed in electrical contact with the terminal part 3*b*, and the electrode terminal 10*c* is placed in contact with the mount 8. A DC voltage is then applied across the electrode terminal 10*a* and electrode terminal 10*c* to anodically bond the ink chamber substrate 3 and orifice substrate 6.

Next, as shown in FIG. 7(*c*), an ink-repellent layer 15 is formed on a surface of the orifice substrate 6. The ink-repellent layer 15 makes it possible to control the wettablility of the orifice surface, preventing misdirections of ink ejection and ejection failures. The ink-repellent layer 15 can be formed of a polymer film, such as a fluorine polymer. A fluorine-polymer film can withstand a temperature of at most 200° C. and cannot withstand temperatures reached during anodic bonding (more than 400° C.). Therefore, the ink-repellent process is performed after anodic bonding. Further, when integrating the orifice substrate 6, ink chamber substrate 3, and diaphragm substrate 1, as described in the first and second embodiments, it is difficult to perform the ink-repellent process only on the surface of the orifice substrate 6.

Next, a method of forming the ink-repellent layer 15 on the surface of the orifice substrate 6 will be described. After the ink chamber substrate 3 and the orifice substrate 6 are joined by anodic bonding, the bonded structure is soaked in a fluorine-polymer solution to form an ink-repellent layer over the entire surface of the bonded structure. Subsequently, a dry resist film with a thickness of 25 μm is applied to the surface of the orifice substrate 6 and is bonded by heat and pressure. When forming an ink-repellent layer near the interior of the nozzle inlets, the dry resist film is inserted into the nozzles at a prescribed depth. Next, the ink-repellent layer in areas not covered by the dry resist film is removed with oxygen plasma. Subsequently, the dry resist film is removed. FIG. 7(*c*) shows the ink-repellent layer 15 formed on the surface of the orifice substrate 6 and inserted into the inlets of the nozzles 7 at a prescribed depth. In this way, it is necessary to remove the ink-repellent layer with oxygen plasma from areas other than the surface of the orifice substrate 6. As a result, it is difficult to perform the ink-repellent process only on the surface of the orifice substrate 6 when the orifice substrate 6, ink chamber substrate 3, and diaphragm substrate 1 are bonded together as in the first and second embodiments.

In another method for forming the ink-repellent layer 15, the dry resist film is applied to the surface of the orifice substrate 6 as masking tape after anodically bonding the ink chamber substrate 3 and orifice substrate 6 together. The dry resist film is inserted into the nozzles to a prescribed depth. Next, a mask layer (not shown) is formed on the side walls of the manifold 11*a* and pressure chambers 11*b* by injecting a water-soluble masking agent into the manifold 11*a* and pressure chambers 11*b*. After peeling off the masking tape, an ink-repellent layer is formed over the surface of the orifice substrate 6. Next, the bonded structure is soaked in water to remove the water-soluble mask layer. Through this process, the ink-repellent layer 15 is formed on the surface of the orifice substrate 6 and in the inlets of the nozzles 7 to a prescribed depth, without forming an ink-repellent layer in the manifold 11*a* and pressure chambers 11*b*, as shown in FIG. 7(*c*).

Next, as shown in FIG. 7(*d*), an adhesive 16 is applied to the side of the ink chamber substrate 3 to be bonded to the diaphragm substrate, and a diaphragm plate 17 is mounted on the adhesive 16. The material of the diaphragm plate 17 is a polymer film such as polyimide resin, aramid resin, or polysulfan resin. Further, while the glass layer 5 was formed on the surface of the ink chamber substrate 3 to be bonded to the diaphragm substrate in FIG. 7(*a*), it is not necessary to form the glass layer 5 on this side since this surface is not subjected to anodic bonding.

Figure 9:
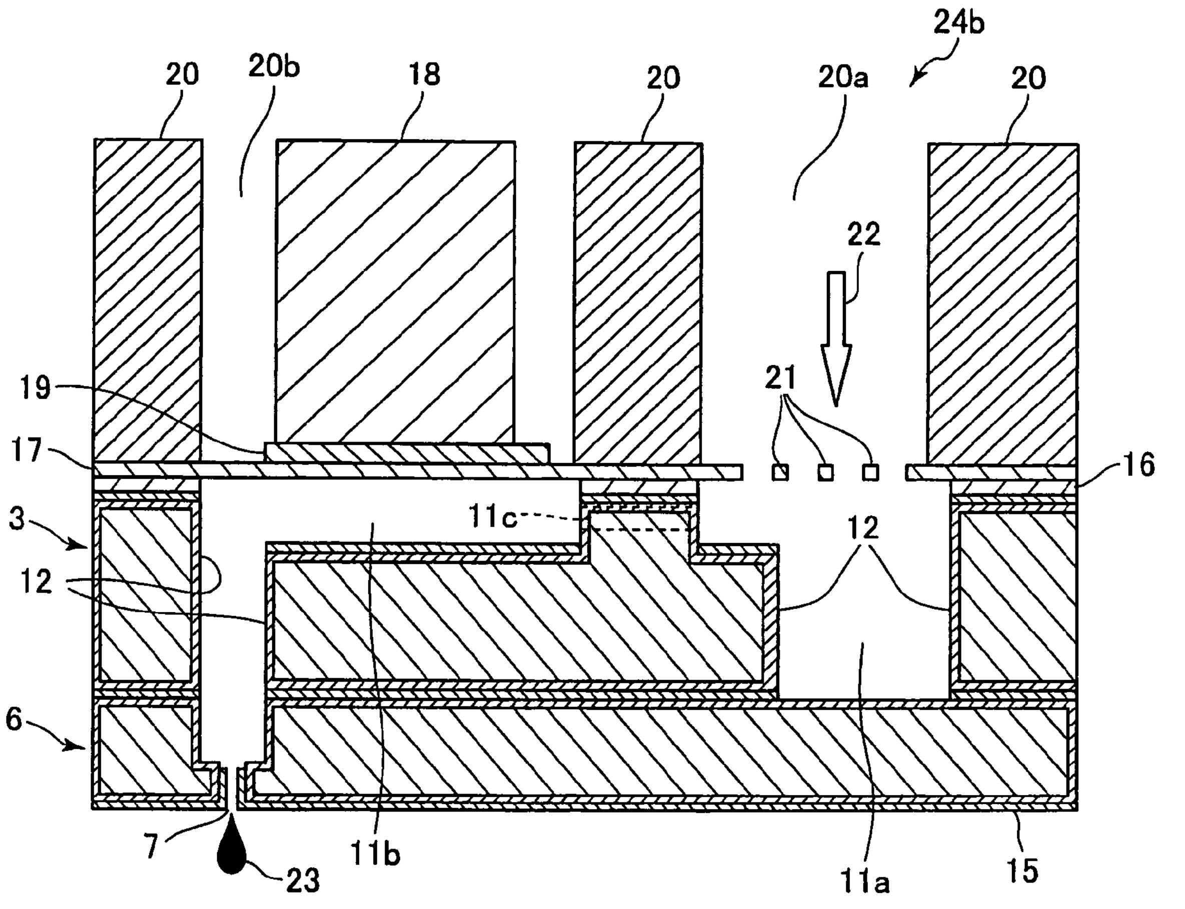
FIG. 9 is a schematic diagram of an inkjet head according to the third embodiment.

FIG. 9 shows an inkjet head 24*b* according to a third embodiment of the present invention constructed by mounting a stainless steel housing 20 on the bonded structure of the orifice substrate 6, ink chamber substrate 3, and diaphragm plate 17 manufactured according to the method of the third embodiment and subsequently bonding the piezoelectric element 18 to the diaphragm plate 17 with the adhesive 19. The diaphragm plate 17 can be manufactured of a Fe42-Ni or a stainless steel member. While such members have less resistance to corrosion by acidic ink, they can withstand other types of ink.

When manufacturing the diaphragm substrate 1 by MEMS machining of single-crystal silicon 40, as in the first and second embodiments, anodic bonding can be performed to eliminate the use of adhesive, thereby improving the corrosive resistance of the inkjet head. However, the diaphragm substrate 1 formed of single-crystal silicon 40 is very thin (approximately, a few μm in thickness) and very breakable, the diaphragm substrate 1 must be handled carefully during assembly. However, when forming the diaphragm plate 17 of polymer film, Fe42-Ni, stainless steel, and the like, as in the third embodiment, the diaphragm plate 17 is much less likely to break. The diaphragm plate 17 is also inexpensive and easy to handle.

When formed of polyimide resin, the diaphragm plate 17 is not corrosion resistant to ink containing a polar solvent, such as NMP (N-methylpyrrolidone) or the like. However, the diaphragm plate 17 can withstand acidic or alkaline industrial inks used in forming interconnections, display panels, or the like, as well as water-based, oil-based, solvent, or UV inks.

(3) Inkjet Recording Device

Figure 10:
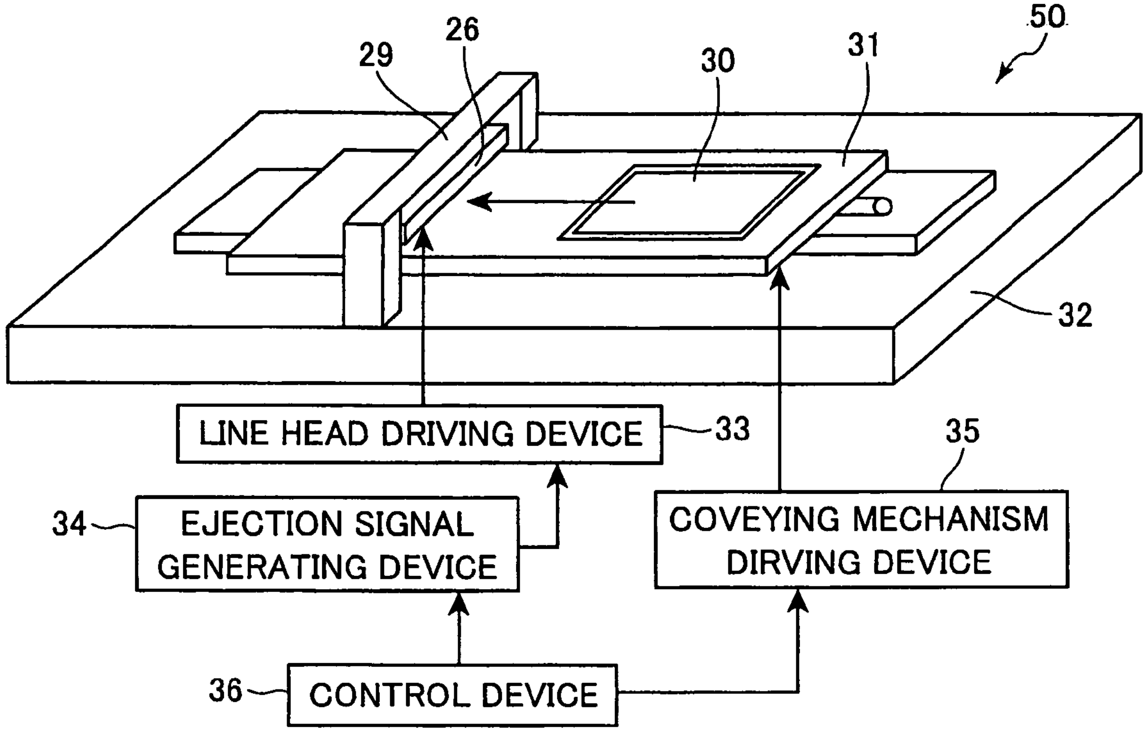
FIG. 10 is a perspective view and block diagram of an inkjet recording device according to the present invention.
Figure 11:
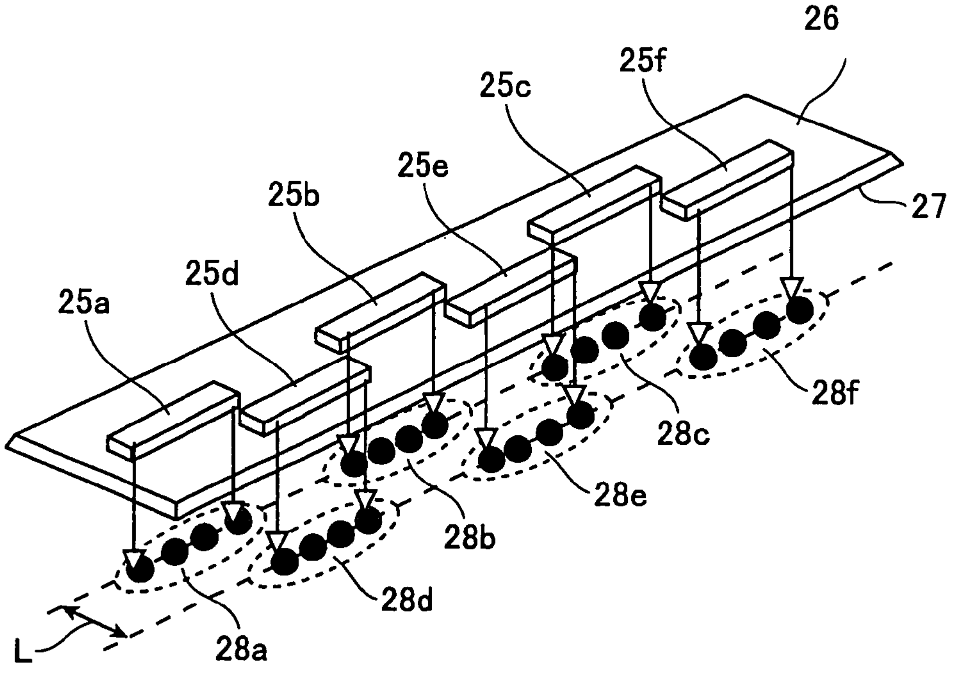
FIG. 11 is a perspective view of a line head in the inkjet recording device according to the present invention.

FIGS. 10 and 11 show the structure of an inkjet recording device 50 according to a preferred embodiment of the present invention. The inkjet recording device 50 has a base 32; a conveying mechanism 31 disposed on the base 32 for conveying a recording medium 30, such as paper, glass, metal, or plastic; a mounting member 29 disposed on the base 32; and a line head 26 having a plurality of nozzles mounted in the mounting member 29. The line head 26 is mounted in the mounting member 29 so that a gap of 1-5 mm, for example, is formed between the line head 26 and the recording medium 30.

The inkjet recording device 50 includes a line head driving device 33 for controlling drive voltages applied to piezoelectric elements corresponding to each nozzle in the line head 26; an ejection signal generating device 34 for generating ejection signals and inputting the signals into the line head driving device 33; a conveying mechanism driving device 35 for controlling the timing at which the conveying mechanism 31 conveys the recording medium 30; and a control device 36 for controlling the ejection signal generating device 34 and conveying mechanism driving device 35.

More specifically, the control device 36 transmits a control signal to the conveying mechanism driving device 35 for controlling the timing for conveying the recording medium 30, and transmits a control signal to the ejection signal generating device 34 for controlling the timing at which the ejection signal generating device 34 transfers data.

Next, the line head 26 will be described in detail. As shown in FIG. 11, the line head 26 has a base plate 27. Heads 25*a*-25*f* are disposed in a staggered arrangement on the line head 26. The heads 25*a*-25*f* have the same cross-sectional structure as the inkjet head 24*a* shown in FIG. 2 or the inkjet head 24*b* shown in FIG. 9. If the heads 25*a*-25*f* eject ink droplets simutaneously, first ink droplet rows 28*a*, 28*b*, and 28*c* are separated from second ink droplet rows 28*d*, 28*e*, and 28*f* by a gap L. However, by controlling the ejection timing, it is possible to eject both the first and second ink droplet rows along the same line.

The heads 25*a*-25*f* according to the preferred embodiment are manufactured of the orifice substrate 6 described above using a MEMS machining process to form the nozzles 7 therein. Accordingly, the heads 25*a*-25*f* are formed with high precision, with extremely little variation in nozzle diameter, depth and other dimensions among nozzles in the same head and between different heads. The positioning of the nozzles is also extremely accurate. The ink chamber substrate 3 has also been manufactured with high precision and has little variation in the shape and dimension of ink chambers (pressure chambers, restrictors, manifolds, and the like) within the same head or among different heads, which differences could affect ink ejection performance.

Since adhesive is not used for bonding the orifice substrate 6 and ink chamber substrate 3 together, the heads 25*a*-25*f* do not suffer from problems associated with the use of adhesive, such as irregular thicknesses of the adhesive layer, and clogging of nozzles due to adhesive protruding near the nozzles or parts of the adhesive layer breaking off. Therefore, it is possible to produce inkjet heads having uniform ink ejection properties among heads and among nozzles within each head, and to produce inkjet heads that have high reliability in withstanding various types of ink.

Further, since the nozzles 7 can be produced with microdiameters through micromachining, the nozzles 7 can eject microdroplets of ink.

(4) Uses and Applications of the Inkjet Recording Device

Next, examples of uses and applications for the inkjet recording device according to the present invention will be described.

(a) Alignment Layer of Liquid Crystal Display

The inkjet head 24*a* of FIG. 2 can be used for applications requiring the printing of uniform solid films by ejecting NMP solvent for polyimide resin on liquid crystal panel substrates formed of glass, plastic, or the like to produce circuits containing TFT (thin film transistors), and color filters.

(b) Patterning of Color Filters and Color Organic EL Material

While a single line head 26 is shown in the inkjet recording device of FIG. 10, the inkjet recording device can be used for patterning a panel substrate formed of glass, plastic, or the like as the recording medium 30 by providing three of the line heads corresponding to the colors red, green, and blue for ejecting color filter material or light-emitting material in these three colors. The inkjet heads used in the inkjet recording device may be either the inkjet head 24*a* shown in FIG. 2 or the inkjet head 24*b* shown in FIG. 9.

(c) Color Printing

Alternatively, four line heads may be mounted in the inkjet recording device corresponding to the colors yellow, magenta, cyan, and black. This inkjet recording device can perform color printing by ejecting ink of these four colors on the recording medium 30 formed of paper or plastic. In this inkjet recording device, the inkjet head 24*b* shown in FIG. 9 can be used when the color ink is a water-based, oil-based, or normal solvent type ink.

(d) Interconnect Patterning

The inkjet heads of the preferred embodiments described above can be used to print interconnect patterns by ejecting an electrically conductive ink having metal nanoparticles of silver, copper, or the like on the surface of a polyimide resin film or a ceramic substrate. These inkjet heads can support the formation of interconnections having a line width less than 50 μm, which requires that microdroplets of 3 picoliters or less be ejected at prescribed positions with high accuracy.

In this case, a water-based or solvent-type ink is used as the electrically conductive ink.

Further, either the inkjet head 24*a* shown in FIG. 2 or the inkjet head 24*b* shown in FIG. 9 may be used. In this example, the nozzles in the orifice substrate 6 are preferably formed as micronozzles having a diameter of approximately 20-25 μm by machining.

In the embodiments described above, the inkjet recording device is configured of a fixed line head that conveys a recording medium. However, the present invention may also be applied to a serial type inkjet recording device with a movable inkjet print head.

While the method of anodically bonding silicon members of the present invention is used for manufacturing an inkjet head, this method may also be used for manufacturing sensors or other products constructed by bonding a plurality of silicon parts together.

What is claimed is:

1. A method of manufacturing an inkjet head, the method comprising:

manufacturing an ink chamber substrate having pressure chambers, a diaphragm substrate having a diaphragm for pressurizing the pressure chambers, and an orifice substrate having nozzle holes for ejecting ink, each of ink chamber substrate, the diaphragm substrate, and the orifice substrate being formed from silicon material;

forming a silicon dioxide ($SiO_2$) layer on a surface of the ink chamber substrate;

forming a glass layer on a surface of the silicon dioxide ($SiO_2$) layer;

forming an oxygen-deficient silicon oxide ($SiO_x$, x<2) layer on a surface of the orifice substrate and the diaphragm substrate; and anodically bonding the diaphragm substrate, orifice substrate, and ink chamber substrate by sequentially laminating the diaphragm substrate, ink chamber substrate, and orifice substrate and applying a DC voltage across the ink chamber substrate, the diaphragm substrate, and the orifice substrate.

2. The method of manufacturing an inkjet head according to claim 1, wherein, in the step of anodically bonding, the orifice substrate, ink chamber substrate, and diaphragm substrate are laminated in order on a mount with a built-in heater, while a pressing/heating plate with a built-in heater is disposed on top of the diaphragm substrate, and the DC voltage is applied across the ink chamber substrate and the mount, arid the ink chamber substrate and the pressing/heating plate.

3. The method of manufacturing an inkjet head according to claim 1, wherein, in the step of anodically bonding, the orifice substrate, ink chamber substrate, and diaphragm substrate are laminated in order on a mount with a built-in heater, while a pressing/heating plate with a built-in heater is disposed on top of the diaphragm substrate, and the DC voltage is applied across the ink chamber substrate and the diaphragm substrate, and the ink chamber substrate and the mount.

4. A inkjet head comprising:

an ink chamber substrate having pressure chambers;

a diaphragm substrate bonded to the ink chamber substrate;

a piezoelectric element bonded to the diaphragm substrate for applying pressure to the pressure chambers in response to electric signals; and an orifice substrate having nozzle holes for ejecting ink, the orifice substrate being bonded to the ink chamber substrate and being pressurized by the diaphragm substrate, the pressure chambers being in fluid communication with the nozzle holes;

wherein the ink chamber substrate comprises a silicon member, a silicon dioxide ($SiO_2$) layer formed on a surface of the silicon member, and a glass layer formed on a surface of the silicon dioxide ($SiO_2$) layer;

the orifice substrate and the diaphragm substrate each comprises a silicon member, and a silicon oxide ($SiO_x$, x<2) layer formed on a surface of the silicon member; and the ink chamber substrate, orifice substrate, and diaphragm substrate are joined together by anodic bonding.

5. An inkjet recording device comprising:

the inkjet head according to claim 4; and a control unit that controls the inkjet head.

* * * * *